US007863113B2

(12) United States Patent
Roca I Cabarrocas et al.

(10) Patent No.: US 7,863,113 B2
(45) Date of Patent: Jan. 4, 2011

(54) TRANSISTOR FOR ACTIVE MATRIX DISPLAY AND A METHOD FOR PRODUCING SAID TRANSISTOR

(75) Inventors: Pere Roca I Cabarrocas, Paris (FR); Régis Vanderhaghen, Palaiseau (FR); Bernard Drevillon, Clamart (FR)

(73) Assignees: Centre National de la Recherche Scientifique, Paris (FR); Ecole Polytechnique, Palaiseau (FR)

( * ) Notice: Subject to any disclaimer, the term of this patent is extended or adjusted under 35 U.S.C. 154(b) by 1045 days.

(21) Appl. No.: 10/544,787

(22) PCT Filed: Feb. 6, 2004

(86) PCT No.: PCT/EP2004/001107

§ 371 (c)(1),
(2), (4) Date: May 26, 2006

(87) PCT Pub. No.: WO2004/070848

PCT Pub. Date: Aug. 19, 2004

(65) Prior Publication Data

US 2006/0240602 A1    Oct. 26, 2006

(30) Foreign Application Priority Data

Feb. 6, 2003 (EP) .................................. 03290304

(51) Int. Cl.
*H01L 21/00* (2006.01)

(52) U.S. Cl. ..................... 438/149; 438/30; 438/485; 257/E29.292; 257/E29.293; 257/E29.294

(58) Field of Classification Search .................... 438/29, 438/30, 69, 82, 99, 149, 151, 161, 485, 676, 438/680; 257/E29.292, E29.293, E29.294
See application file for complete search history.

(56) References Cited

U.S. PATENT DOCUMENTS 5,403,756 A * 4/1995 Yoshinouchi et al. ....... 438/162
5,686,349 A    11/1997 Nakata (Continued)

OTHER PUBLICATIONS

Roca et al., "Stable microcrystalline silicon thin-film transistors produced by the layer-by-layer technique", Journal of Applied Physics, 1999 American Institute of Physics, pp. 7079-7082.*

(Continued)

*Primary Examiner*—Ha Tran T Nguyen
*Assistant Examiner*—Daniel Whalen
(74) *Attorney, Agent, or Firm*—Young & Thompson

(57) ABSTRACT

A transistor for active matrix display and a method for producing the transistor (1). The transistor (1) includes a microcrystalline silicon film (5) and an insulator (3). The crystalline fraction of the microcrystalline silicon film (5) is above 80%. According to the invention, the transistor (1) includes a plasma treated interface (4) located between the insulator (3) and the microcrystalline silicon film (5) so that the transistor (1) has a linear mobility equal or superior to 1.5 cm2V−1s−1, shows threshold voltage stability and wherein the microcrystalline silicon film (5) includes grains (6) whose size ranges between 10 nm and 400 nm. The invention concerns as well a display unit having a line-column matrix of pixels that are actively addressed, each pixel comprising at least a transistor as described above.

11 Claims, 4 Drawing Sheets

U.S. PATENT DOCUMENTS

| | | | |
|---|---|---|---|
| 5,796,116 A | * | 8/1998 | Nakata et al. .................. 257/66 |
| 6,017,779 A | | 1/2000 | Miyasaka |
| 6,078,059 A | * | 6/2000 | Nakata ........................ 257/57 |
| 2003/0054586 A1 | * | 3/2003 | Shtein et al. .................. 438/99 |

OTHER PUBLICATIONS

Roca I Cabarrocas P et al: "Stable Microcrystalline Silicon Thin-Film Transistors Produced by the Layer-By-Layer Technique" Journal of Applied Physics, American Institute of Physics. New York, US, vol. 86, No. 12, Dec. 15, 1999, pp. 7079-7082, XP000928312 ISSN: 0021-8979 cited in the application p. 7079.

Young-Bae Park et al: "Effect of Hydrogen Plasma Precleaning on the Removal of Interfacialamorphous Layer in the Chemical Vapor Deposition of Microcrystalline Silicon Films on Silicon Oxide Surface" Applied Physics Letters, American Institute of Physics. New York, US, vol. 68, No. 16, Apr. 15, 1996, pp. 2219-2221, XP000585161 ISSN: 0003-6951 p. 2219.

* cited by examiner

TRANSISTOR FOR ACTIVE MATRIX DISPLAY AND A METHOD FOR PRODUCING SAID TRANSISTOR

This application is a Nation Stage Application of International Application PCT/EP2004/001107, filed Feb. 6, 2004.

BACKGROUND OF THE INVENTION

1. Field of the Invention

The invention relates to a transistor for active matrix display, a display unit comprising the said transistor and a method for producing the said transistor.

2. Description of Related Art

Since the advent of the portables and the need for flat display panels, electronic displays implementing thin-film transistor technology and liquid crystals have experienced a phenomenal growth, to the point where full-colour displays have been realised that can compete with cathode ray tube displays. Amorphous silicon thin-film transistors are extensively used as pixel charging devices in active matrix liquid crystal displays, principally because of its application to large glass substrates, low cost and remarkable matching with the requirements of liquid crystal driving. Over the last decade, a rapidly growing demand for high information content displays offering high performances (excellent contrast, homogeneity of colours, high luminance, large viewing angles . . . ) and having sizes down to "micro-panel", for mobile phones for example, has nonetheless raised a huge interest for new technologies like organic light emissive diodes (OLED), polymer material based light emissive diodes (PLED), . . . The response time of OLED devices makes them perfectly suitable for video rate.

This demand adds constraints on the active material used in thin film transistors for active matrix displays, namely a higher stability and a more rapid charging than amorphous silicon (a-Si:H) thin films can provide. It is also necessary for a higher integration and to further reduce the cost of the display to process the driving circuits directly on the glass panel instead of connecting external circuits.

It is known that microcrystalline silicon (μc-Si:H) is compatible with amorphous silicon technology and can be directly deposited using plasma deposition technology at low temperatures without further thermal or laser treatment.

However, up to date studies of μc-Si:H thin films {ROCA I CABARROCAS, P et al.; J. Appl. Phys. 86 (1999) 7079 and references cited therein} have only reported linear mobilities similar to those of a-Si:H thin film transistors. Therefore, no improvement would be expected from these studies on the charging time of pixels using said μc-Si:H thin film transistors and on the driving circuit integration.

SUMMARY OF THE INVENTION

The purpose of the invention is hence to remedy the shortcomings mentioned above and to propose a transistor for active matrix display having one or more of the following features and advantages: namely, a high field effect mobility, an excellent threshold voltage stability, a high level of drive circuit integration and a high duty ratio, offering a low cost transistor for pixel-charging devices used in active matrix displays.

In addition, the invention has as an objective a method for producing a transistor for active matrix display, this method being at once rapid and easy to implement, in particular, in industrial transistor manufacturing devices.

To this end, the invention concerns a transistor for active matrix display comprising a microcrystalline silicon film and an insulator, the crystalline fraction being above 80%.

According to the invention, said transistor comprises a plasma treated interface located between the insulator and the microcrystalline silicon film so that the said transistor has a linear mobility equal or superior to $1.5 \text{ cm}^2\text{V}^{-1}\text{s}^{-1}$ and shows threshold voltage stability.

The microcrystalline silicon film is composed of a mixture of amorphous tissue and crystallites that are crystallised grains. We shall call hereinafter "Crystalline fraction", the ratio by volume of the said grains. At a crystalline fraction of 100%, microcrystalline silicon films without any amorphous phase are achieved. In other words, the thin film is fully crystallised.

We shall call hereinafter "Threshold voltage stability", a threshold voltage shift equal or inferior to 0.5 V with time when the thin film transistor Is submitted to a bias stress. Typical stress tests are performed for example under a gate voltage of 30 V and at a substrate temperature of 60° C.

According to various embodiments, the present invention also concerns the characteristics below, considered individually or in all their technical possible combinations.
- the microcrystalline silicon film comprises grains whose size ranges between 10 nm and 400 nm,
- said grain size ranges between 100 nm and 200 nm,
- the microcrystalline silicon film thickness is comprised between 100 nm and 450 nm,
- said transistor has a top-gate electrode,
- said transistor has a bottom-gate electrode,
- the microcrystalline silicon film is produced by hot wire technique,
- the microcrystalline silicon film is produced by radiofrequency glow discharge technique.

The invention concerns as well a display unit having a line-column matrix of pixels that are actively addressed. According to the invention, each pixel comprises at least a transistor as previously described.

According to various embodiments, the present invention also concerns the characteristics below, considered individually or in all their technical possible combinations.
- said pixels comprise light emissive organic materials,
- said pixels comprise liquid crystals,
- said pixels comprise light emissive polymer materials,
- electronic control means to drive each pixel are at least partially integrated on the corresponding microcrystalline silicon film.

The display unit described above can be advantageously applied with a device selected from the group comprising a computer, a video camera, a digital camera, a portable terminal, a player for recorder media, an electronic game equipment and a projector. The invention concerns as well a method for producing a transistor for active matrix display comprising the steps of forming an active material and electrodes, said active material being formed using vapor deposition methods and said transistor comprising an insulator. According to the invention,
- one forms a plasma treated interface on top of said insulator, and
- one forms a microcrystalline film on top of said treated interface at a temperature comprised between 100 and 400° C. using at least a deposition chemical element and a crystallisation chemical element.

According to various embodiments, the present Invention also concerns the characteristics below, considered individually or in all their technical possible combinations.

said plasma treated interface is selected from the group consisting of a $SiN_x$ layer, a $SiN_xO_y$ layer, a $SiO_2$ layer and glass, one forms the plasma treated interface using a gas selected from the group consisting of $N_2$, $O_2$, $N_2O$ and $NH_3$, The insulator is treated by plasma deposition to form a plasma treated interface so as to reduce the density of nucleation sites.

the microcrystalline silicon film is formed using a buffer gas selected from the group consisting of Ar, Xe, Kr and He, said crystallisation chemical elements is $H_2$, said deposition chemical elements are selected among the group comprising $SiH_4$, $SiF_4$, said deposition chemical elements flux and said crystallisation chemical elements flux are at equilibrium during the growth of the microcrystalline silicon film, one forms a top gate transistor, one patterns a substrate comprising a metallic layer to form source and drain electrodes, one forms a bottom gate transistor, a substrate comprises a gate electrode, the microcrystalline silicon film comprises grains whose size ranges between 10 nm and 400 nm, the microcrystalline silicon film thickness is comprised between 100 nm and 450 nm, the vapor deposition methods use radiofrequency glow discharge technique, one uses a 13.56 MHz PECVD reactor.

A "13.56 MHz PECVD reactor" means here a reactor powered by radiofrequency energy at a frequency of 13.56 MHz used with a plasma enhanced chemical vapour deposition method.

BRIEF DESCRIPTION OF THE DRAWINGS

To facilitate further description of the invention, the following drawings are provided in which.

Figure 1:
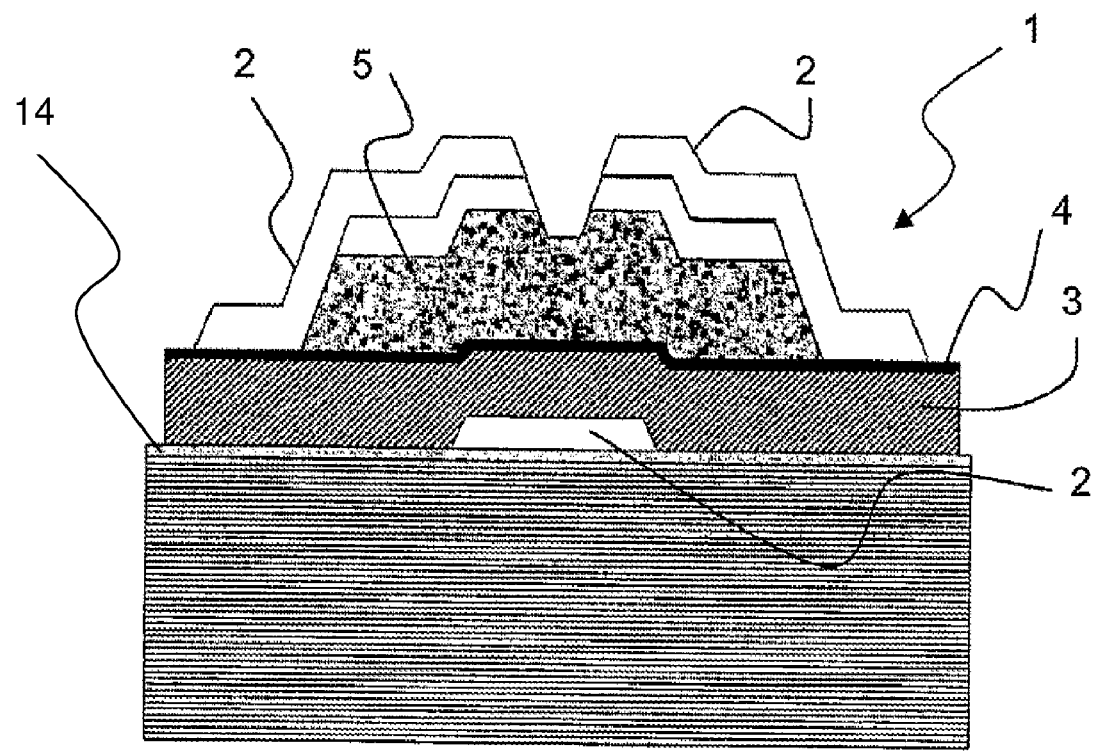
FIG. 1 is a schematic view of a thin film transistor structure for a bottom gate transistor according to the invention.

These drawings are provided for illustrative purposes only and should not be used to unduly limit the scope of the invention.

DETAILED DESCRIPTION OF THE INVENTION

The invention concerns a method for producing a transistor 1 for active matrix display comprising the steps of forming an active material 14 and electrodes 2, said active material being formed using vapor deposition methods and said transistor 1 comprising an insulator 3. The 20 vapor deposition methods use, for example, radiofrequency glow discharge technique. In a particular embodiment, one uses a 13.56 MHz PECVD reactor. However, said reactor can be powered by radiofrequency energy at another frequency. The vapor deposition methods can implement also a microwave ECR (electron cyclotron resonance) technique.

According to the invention, one forms a plasma treated interface 4 on top of said insulator 3. In a preferred embodiment, said treated interface 4 is selected from the group consisting of a $SiN_x$ layer, a $SiN_xO_y$ layer, a $SiO_2$ layer and glass. The plasma treated interface 4 can be formed using a gas selected from the group consisting of $N_2$, $O_2$, $N_2O$ and $NH_3$.

One then forms on top of said treated interface 4, a microcrystalline film 5 at a temperature comprised between 100 and 400° C. using at least a deposition chemical element and a crystallisation chemical element. Said crystallisation chemical element is said to promote the crystallisation of the μc-Si:H thin film 5 and is, for example, $H_2$. The crystallisation chemical element and the deposition element can be deposited together or alternately with time. The deposition chemical elements are selected among the group comprising $SiH_4$, $SiF_4$. A buffer gas can be added to optimise the plasma conditions, said gas being chosen from the group consisting of Ar, Xe, Kr and He.

In a particular implementation, hydrogen is used through plasma deposition as a crystallisation element for the formation of μc-Si:H films. The hydrogen plasma exposure of a-Si:H films formed from pure silane crystallises said a-Si:H films through its surface and subsurface reactions. The method then consists in repeating many times the deposition of a-Si:H during a time $\tau_1$ followed by its exposure to a hydrogen plasma during a time $\tau_2$. The μc-Si:H thin film is said to be formed by plasma deposition from a $SiH_4$, $H_2$ mixture. In a preferred embodiment, the deposition chemical elements flux and the crystallisation chemical elements flux are at equilibrium during the growth of the microcrystalline silicon film 5.

The microcrystalline silicon film 5 has a thickness which is comprised between 100 nm and 450 nm and comprises grains 6 whose size ranges between 10 nm and 400 nm.

For the preparation of either bottom gate or top gate transistors, the microcrystalline silicon film 5 is grown on an insulator 3. High mobility microcrystalline silicon 5 is obtained when the insultor 3 is treated so that the density of nucleation sites is reduced. This treatment can be achieved either for bottom gate or for top gate transistors.

In a first embodiment, a top gate transistor is formed, one patterns a substrate comprising a metallic or a TCO (transparent conductive oxide) layer to form source and drain electrodes 2.

In a second embodiment, one forms a bottom gate transistor and the substrate comprises a gate electrode 2. The invention also concerns a transistor 1 for active matrix display. FIG. 1 shows the said transistor 1 according to a particular embodiment of the invention. It comprises a microcrystalline silicon film 5 and an insulator 3, the crystalline fraction being above 80%. The transistor 1 for active matrix display also comprises a plasma treated interface 4 located between the insulator 3 and the microcrystalline silicon film 5 so that the said transistor 1 has a linear mobility equal or superior to 1.5 cm²V⁻¹s⁻¹ and shows threshold voltage stability. Preferentially the crystalline fraction is higher than 85% since an excellent voltage stability is then achieved (the shift is less than 0.15V).

According to the current understanding of said transistor 1 structure, the formation of a plasma treated interface 4 reduces the density of nucleation sites, thus allowing the lateral growth of crystallites 6. Said growth leads to the formation of large grains 6 resulting in a measured higher mobility.

Said microcrystalline silicon film 5 can be produced by hot wire technique or by radiofrequency glow discharge technique.

The microcrystalline silicon film 5 contains crystallites 6 that are crystallised grains 6 having a size ranging between 10 nm and 400 nm. Advantageously, the grain size ranges between 100 nm and 200 nm.

In an embodiment, the microcrystalline silicon film 5 thickness is comprised between 100 nm and 450 nm, and preferentially is comprised between 100 nm and 150 nm to have a low OFF current. A low off current, besides a high linear mobility and stability, is required for an industrial application since it determines the image quality in the electro-optic transducer (liquid crystal display, organic electroluminescent display, . . . ).

FIG. 1 shows a thin film transistor 1 for active matrix display having a bottom-gate electrode, but the transistor 1 can also be realised with a top-gate electrode.

The invention further concerns a display unit having a line-column matrix of pixels comprising at least a transistor 1 as previously described. Said pixels are actively addressed which means that the matrix-type display is scanned line by line over the frame time and a current is supplied to said pixels during the whole frame time. This addressing method makes it perfectly suitable to pixels comprising light emissive organic or polymer materials. It can be advantageously used for pixels comprising liquid crystals. In a preferred embodiment, electronic control means to drive each pixel are at least partially integrated on the corresponding display panel. Hence, the number of external driving circuits is reduced.

The transistor for active matrix display and the method for producing the said transistor according to the invention have been the object of various implementations whose following examples demonstrate the quality of the results obtained.

EXAMPLE 1

Figure 2:
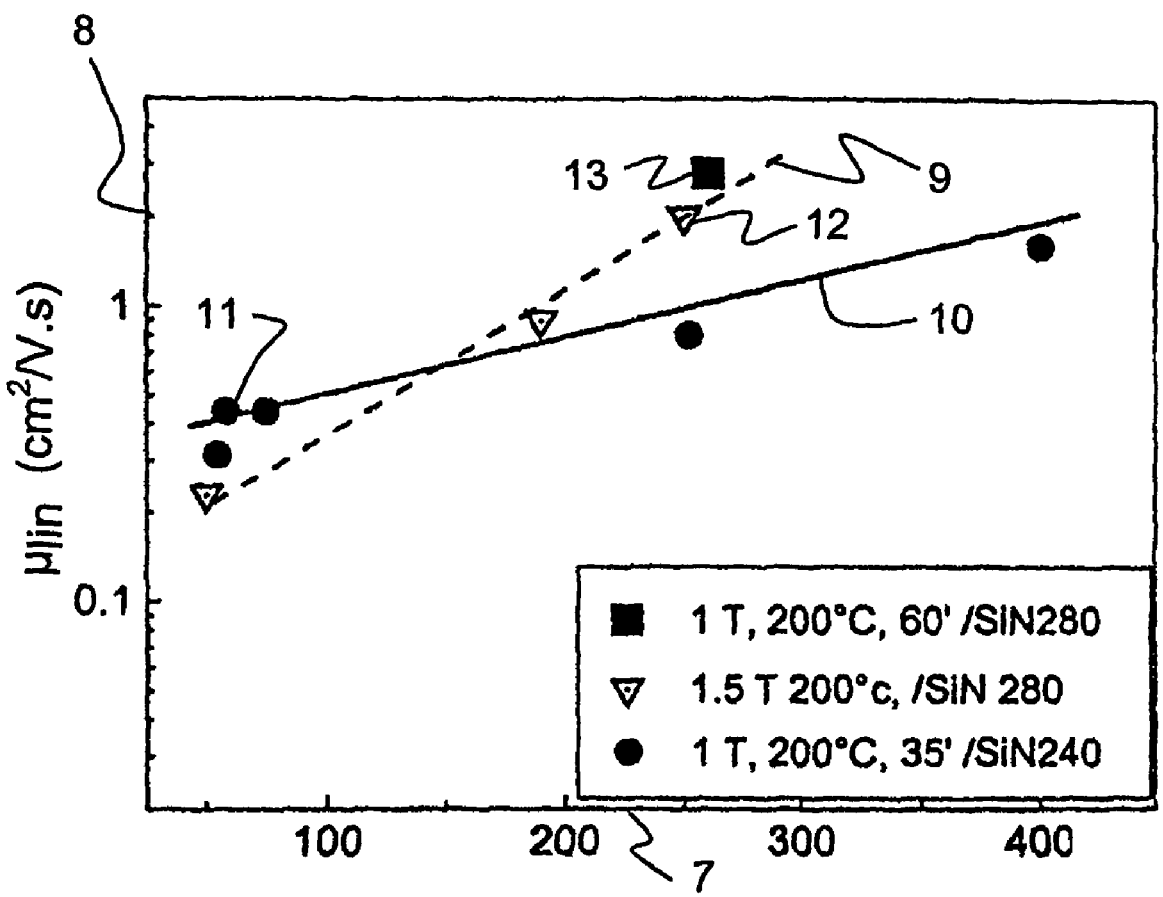
FIG. 2 shows the experimental values obtained as a function of the percolation thickness (nm) for the linear mobility of a μc-Si:H thin film produced from $SiF_4$-Ar-$H_2$ mixtures.

The method for producing a transistor 1 according to the invention has been first implemented to study a bottom gate thin film transistor produced from $SiF_4$-Ar-$H_2$ mixtures. FIG. 2 shows the experimental (circles, respectively inverted triangles) values obtained as a function of the "percolation thickness" (nm) 7 for the linear mobility ($cm^2V^{-1}s^{-1}$) 8 of said μc-Si:H thin film transistor. The "percolation thickness" is a parameter which is defined as the thickness at which the crystalline fraction in the film reaches 100%. The dashed line 9 (respectively solid line 10) Is only shown to provide a guide line to the eye.

The circle values 11 were obtained for a μc-Si:H thin film formed by plasma deposition on a $SiN_x$ substrate under a total pressure of 1 Torr of $SiF_4$-Ar-$H_2$ mixtures and an RF power of 240 mW/cm² for 35 minutes. The inverted triangle values 12 were obtained for a μc-Si:H thin film formed by plasma deposition at a RF power of 280 mW/cm² The pressure of said mixture was 1.5 Torr. The square value 13 was obtained for a μc-Si:H thin film formed by submitting a SiNx substrate to a $SiF_4$-Ar-$H_2$ mixture plasma treatment under a total pressure of 1 Torr and an RF power of 280 mW/cm² for 60 minutes. All these depositions were performed at a temperature of 200° C.

From these experimental values, there is a clear tendency for both series of samples to an increase of the mobility with the increase of the percolation thickness. Hence, despite of having a slow crystallisation velocity, films that end up being fully crystallised have the highest mobilities. Thin film transistors having a mobility of 3 cm²/V.s. are reported.

EXAMPLE 2

Figure 3:
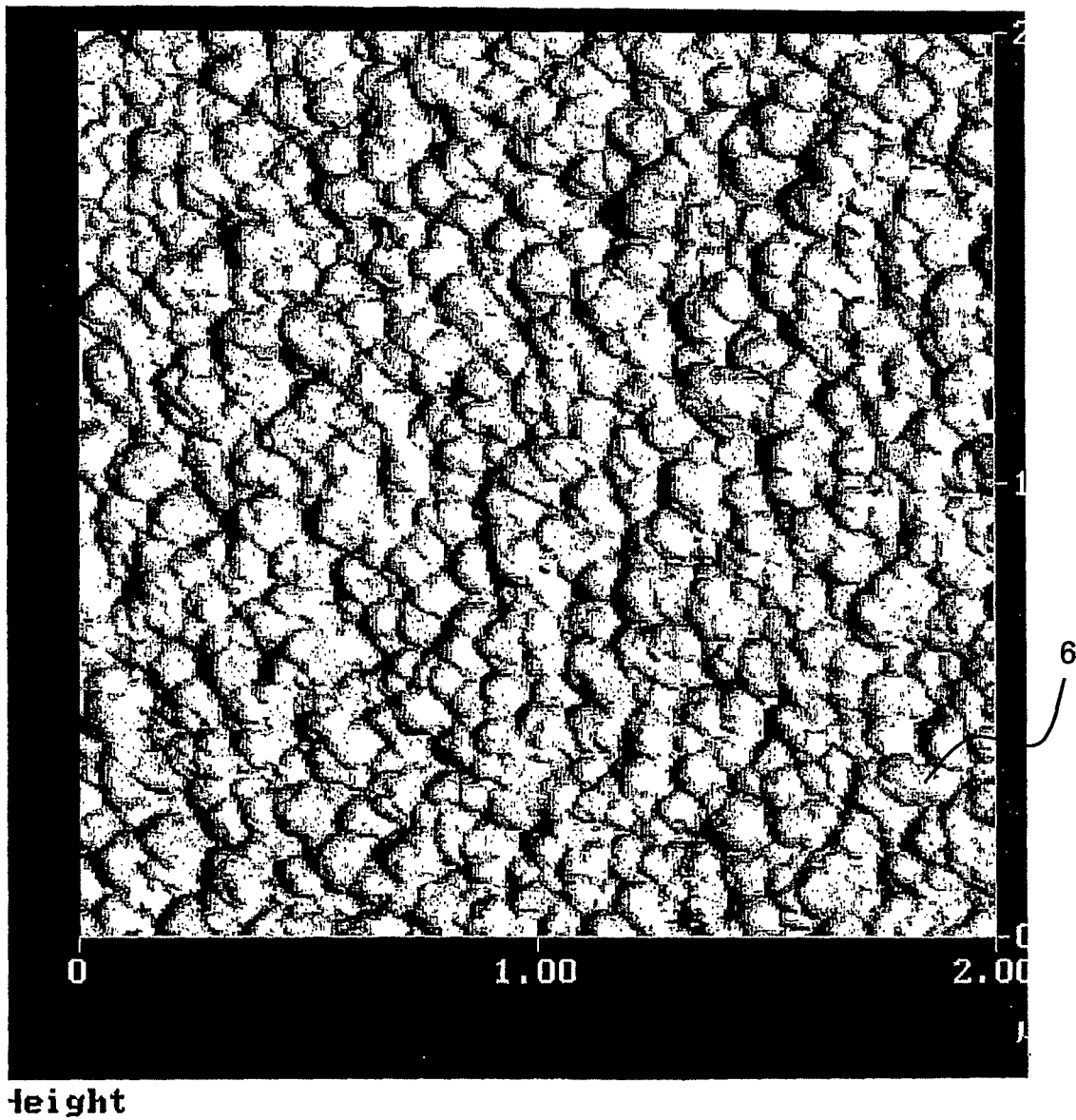
FIG. 3 shows an atomic force microscopy relief of a μc-Si:H thin film produced from $SiF_4$-Ar-$H_2$ mixtures. The μc-Si:H thin film was formed on a $SiN_x$ thin film treated with an Ar plasma. The image extends laterally over an area of 2×2 μm².

FIG. 3 shows an atomic force microscopy (AFM) relief of a μc-Si:H thin film 5. The μc-Si:H thin film 5 was formed by submitting a $SiN_x$ thin film 3 to an Ar plasma and then to a $SiF_4$-Ar-$H_2$ mixture plasma treatment. The image extends laterally over an area of 5×5 μm². Measurements of the thin film transistor realised with said μc-Si:H thin film show values for the linear mobility of the order of 0.02 cm²/V.s. This AFM image clearly shows small crystallites 6 having a mean size less than 80 nm.

Figure 4:
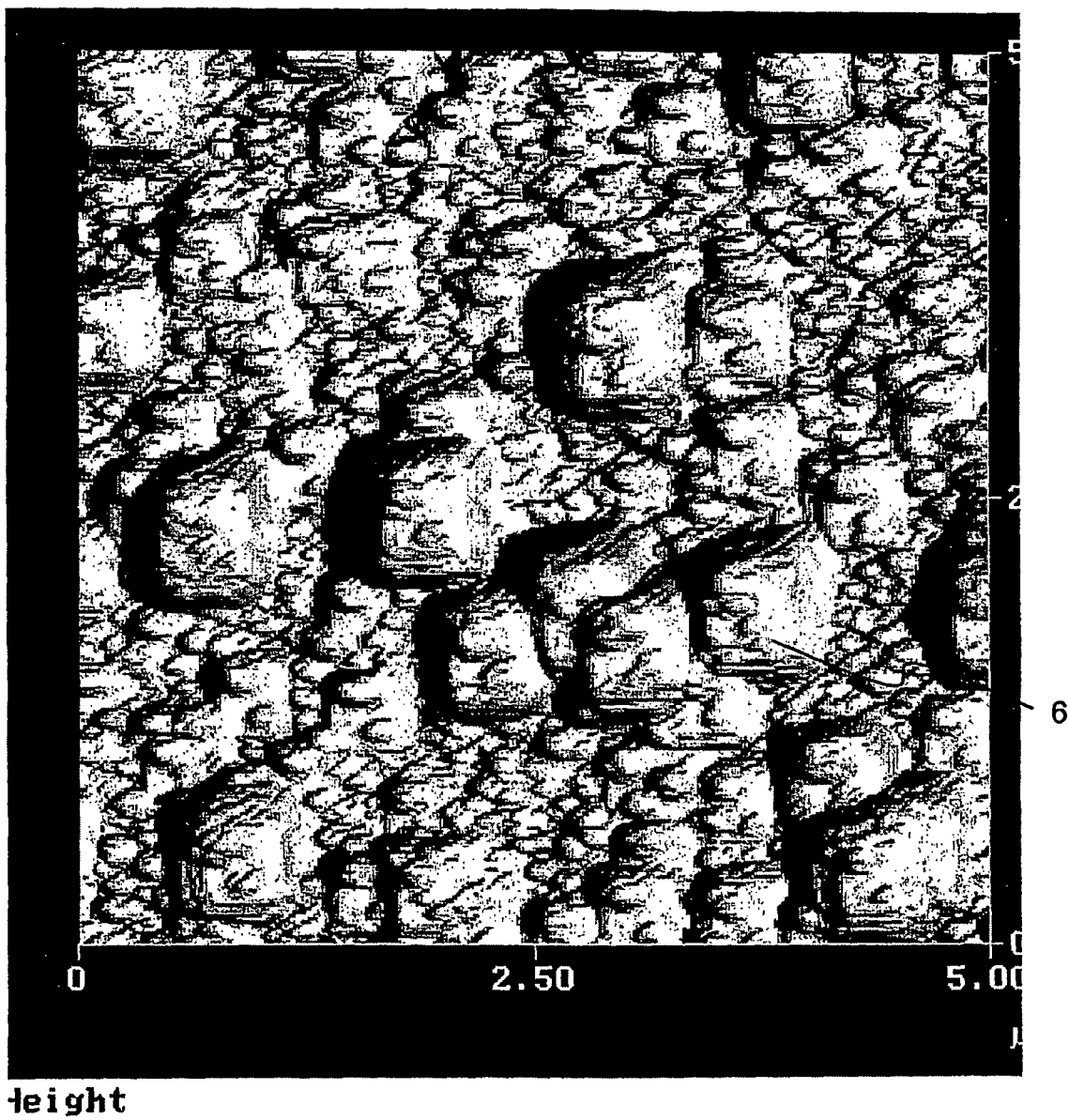
FIG. 4 shows an atomic force microscopy relief of a μc-Si:H thin film produced from $SiF_4$-Ar-$H_2$ mixtures. The μc-Si:H thin film was formed on a $SiN_x$ thin film treated with an $N_2$ plasma. The image extends laterally over an area of 5×5 μm².

FIG. 4 shows an atomic force microscopy relief of a μc-Si:H thin film produced from a $SiF_4$-Ar-$H_2$ mixture. The μc-Si:H thin film was formed on a $SiN_x$ thin film submitted to a $N_2$ treatment. The image extends laterally over an area of 2×2 μm² Measurements of the thin film transistor realised with said μc-Si:H thin film show values for the linear mobility of the order of 3 cm²/V.s. This AFM image clearly shows small crystallites having a mean size of the order of 400 nm.

The formation of a plasma treated $SiN_x$ interface 4 on top of the $SiN_x$ layer 3 before the μc-Si:H thin film 5 deposition clearly promotes the deposition of large grain 6 materials at low temperatures. The linear mobility of the film obtained is then shown to be superior to 2 cm²/V.s.

The invention claimed is:

1. A method for producing a transistor for active matrix display comprising the steps of:
    forming an active material and electrode on a substrate, said active material being formed using a vapor deposition method;
    forming an insulator on top of said active material and electrode;
    forming a plasma treated interface on top of said insulator; and
    forming a microcrystalline silicone film on top of said treated interface at a temperature between 100 and 400° C. using at least a deposition chemical element and a crystallisation chemical element, wherein,
    said microcrystalline silicon film comprises a crystalline fraction of above 80% and said microcrystalline silicon film comprises grains of a size between 10 nm and 400 nm,
    said plasma treated interface is selected from the group consisting of a $SiN_x$ layer, a $SiN_xO_y$ layer, a $SiO_2$ layer and glass,
    said plasma treated interface is formed using a gas, said gas selected from the group consisting of $N_2$, $O_2$, $N_2O$ and $NH_3$, and
    the transistor has a linear mobility greater than or equal to 1.5 $cm^2V^{-1}$ $s^{-1}$.

2. The method for producing a transistor according to claim 1, wherein the microcrystalline silicon film is formed using a buffer gas selected from the group consisting of Ar, Xe, Kr and He.

3. The method for producing a transistor according to claim 1, wherein said crystallisation chemical element is $H_2$.

4. The method for producing a transistor according to claim 1, wherein said deposition chemical element is selected from the group consisting of $SiH_4$ and $SiF_4$.

5. The method for producing a transistor according to claim 1, wherein said deposition chemical element generates a flux and said crystallisation chemical element generates a flux, both of which are at equilibrium during the growth of the microcrystalline silicon film.

6. A method for producing a transistor according to claim 1, wherein a bottom gate transistor is formed.

7. The method for producing a transistor according to claim 1, wherein the microcrystalline silicon film thickness is comprised between 100 nm and 450 nm.

8. The method for producing a transistor according to claim 1, wherein the microcrystalline silicon film is produced by a hot wire technique.

9. The method for producing a transistor according to claim 1, wherein the microscrystalline silicon film is produced by a radiofrequency glow discharge technique.

10. The method for producing a transistor according to claim 1, wherein the vapor deposition methods use a radiofrequency glow discharge technique.

11. The method for producing a transistor according to claim 10, wherein the vapor deposition methods uses a 13.56 MHz PECVD reactor.

* * * * *